United States Patent [19]

Tanimura et al.

[11] Patent Number: 4,509,147
[45] Date of Patent: Apr. 2, 1985

[54] HIGH SPEED SEMICONDUCTOR MEMORY DEVICE HAVING A HIGH GAIN SENSE AMPLIFIER

[75] Inventors: Nobuyoshi Tanimura; Sho Yamamoto; Kazuo Yoshizaki; Isao Akima, all of Tokyo, Japan

[73] Assignees: Hitachi, Ltd.; Hitachi Microcomputer Engineering, Ltd., both of Tokyo, Japan

[21] Appl. No.: 383,945

[22] Filed: Jun. 1, 1982

[30] Foreign Application Priority Data

Jun. 1, 1981 [JP] Japan .................................. 56-82474

[51] Int. Cl.³ ........................................... G11C 11/34
[52] U.S. Cl. .................................... 365/190; 365/207
[58] Field of Search ............. 365/190, 207, 208, 202; 307/530, DIG. 3; 330/253, 310

[56] References Cited

U.S. PATENT DOCUMENTS

| | | | |
|---|---|---|---|
| 3,879,621 | 4/1969 | Cavaliere et al. | 365/207 |
| 4,125,878 | 11/1978 | Watanabe | 365/205 |
| 4,136,292 | 1/1979 | Suzuki et al. | 365/208 |
| 4,138,740 | 2/1979 | Itoh | 365/205 |
| 4,375,039 | 2/1983 | Yamauchi | 330/253 |
| 4,375,619 | 3/1983 | Saari | 330/253 |

FOREIGN PATENT DOCUMENTS 2731442 1/1978 Fed. Rep. of Germany.
2812657 9/1978 Fed. Rep. of Germany.

OTHER PUBLICATIONS

B. J. Hosticka, "Dynamic Amplifiers in CMOS Technology", Electronic Letters, 12/6/79, vol. 15, No. 25, pp. 819–820.
Yasui et al., "High Speed Low Power CMOS Static Rams", Electronic Engineering, Mar. 1981, pp. 51–55.
Elektronik, H. 8, 1980, pp. 30 and 32.

Primary Examiner—Stuart N. Hecker
Assistant Examiner—Glenn Gossage
Attorney, Agent, or Firm—Antonelli, Terry & Wands

[57] ABSTRACT

In a static type RAM, a sense amplifier includes first and second dissymmetric type differential amplifier circuits each of which has a pair of differential transistors and an active load circuit such as a current mirror circuit connected to the drains of the differential transistors. One of balanced signals delivered from a memory cell is supplied to the non-inverting input terminal of the first dissymmetric type differential amplifier circuit and the inverting input terminal of the second dissymmetric type differential amplifier circuit. The other of said balanced signals is applied to the remaining input terminals of the first and second dissymmetric type differential amplifier circuits. As a result, notwithstanding that balanced signals cannot be delivered from each dissymmetric type differential amplifier circuit, amplified balanced signals can be obtained. The operating speed of the RAM can be raised owing to the fact that the dissymmetric type differential amplifier circuit having an active load circuit exhibits a comparatively high gain and the fact that the signal amplification by the balanced circuit is permitted.

16 Claims, 13 Drawing Figures

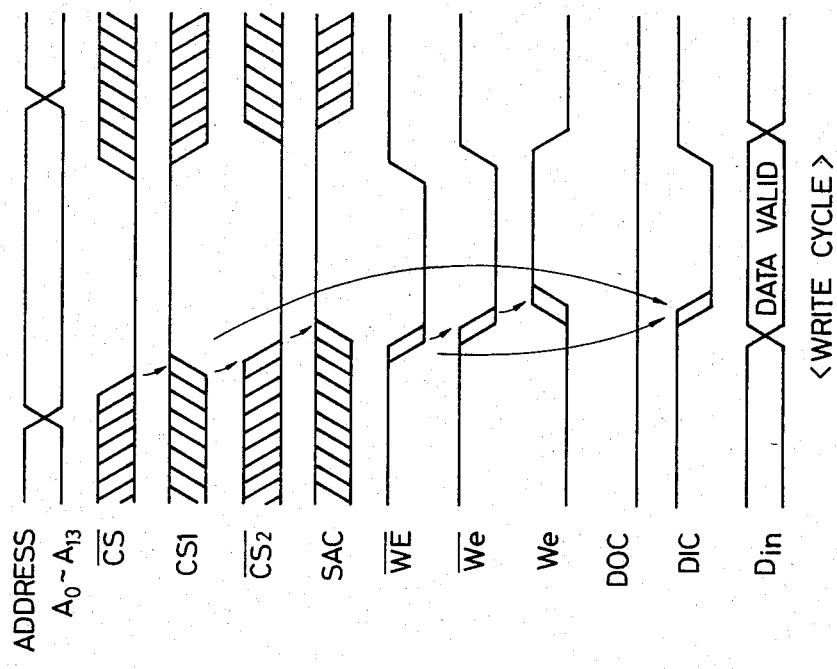
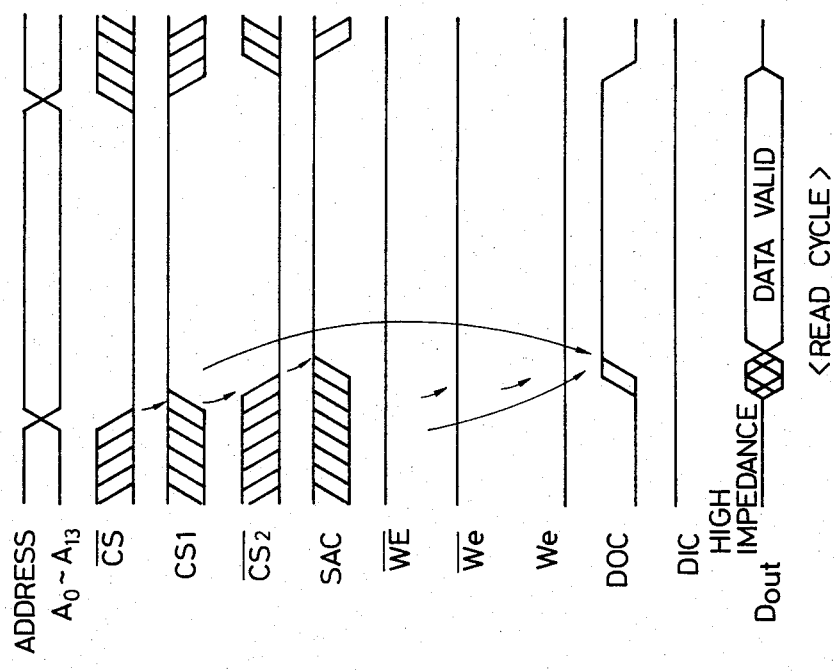

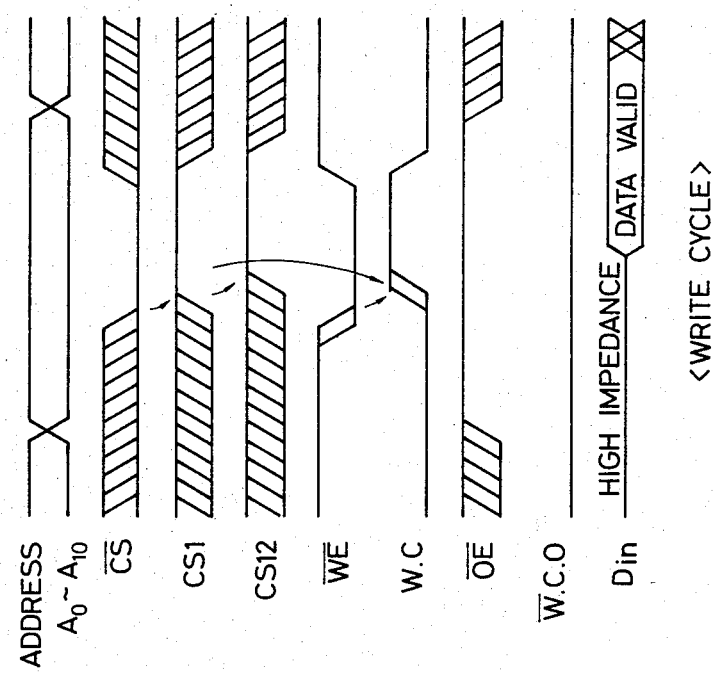
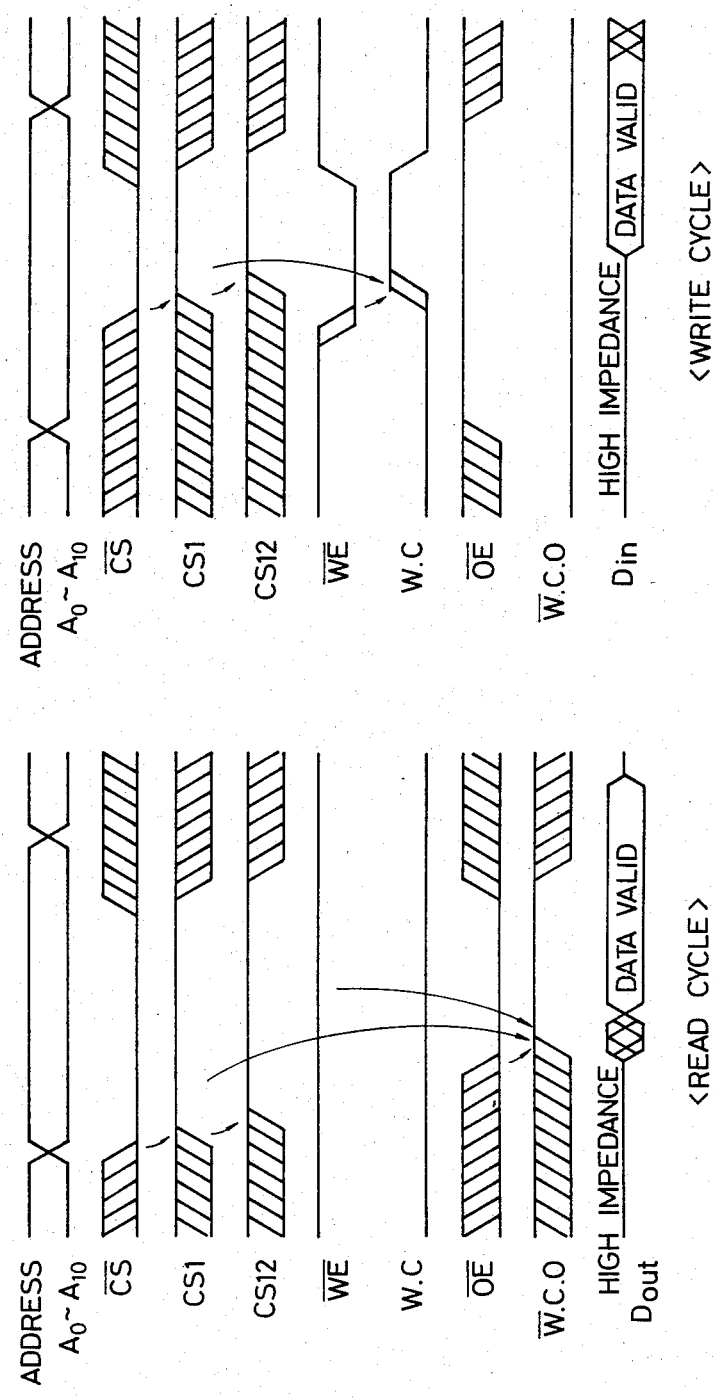
FIG. 3B  <READ CYCLE>
FIG. 3C  <WRITE CYCLE>

P₁,P₂,P₄,P₅ :
DISSYMMETRIC
TYPE DIFFERENTIAL
AMPLIFIER CKT

HIGH SPEED SEMICONDUCTOR MEMORY DEVICE HAVING A HIGH GAIN SENSE AMPLIFIER

BACKGROUND OF THE INVENTION

This invention relates to a semiconductor memory device (hereinbelow, simply termed "memory"), and more particularly to a static type semiconductor random access memory (hereinbelow, abbreviated to "static RAM").

In a static RAM, a pair of information signals complementary to each other which are derived from a memory cell are respectively transmitted to a sense amplifier through a pair of data lines and pair of common data lines CDL and $\overline{CDL}$. The sense amplifier amplifies the potential difference between the pair of common data lines having developed in accordance with the pair of information signals, and transmits the output signal of high level or low level to a data output buffer. The data output buffer detects on the basis of its ligic threshold voltage whether the output signal from the sense amplifier is the high level or the low level, and it delivers the output data of the high level or the low level out of the static RAM in accordance with the detected result.

In "NIKKEI ELECTRONICS 1980. 3. 7.", page 142, FIG. 12, by YASUI et al., it has been proposed and illustrated to employ as the aforementioned sense amplifier a differential amplifier circuit which is constructed of a pair of insulated gate field effect transistors (hereinbelow, termed "MISFETs") coupled in the differential mode, and a current mirror circuit (active load) forming the load of the MISFETs. In this sense amplifier, the output signal is formed on the basis of current equal to the difference between the drain currents of the pair of MISFETs coupled in the differential mode. Therefore, the sensitivity of this sense amplifier can be made comparatively high. Moreover, since the load constituting the differential amplifier circuit is an active load, the gain of the differential amplifier circuit itself can also be made comparatively great, for example, about 5. In order to render the operation of the static RAM faster, however, a sense amplifier having a still higher gain is desired for reasons set forth in the following discussion.

To begin with, since the pair of data lines has a large number of memory cells coupled thereto, the data lines have comparatively large parasitic capacitances. Further, in a static RAM of enlarged memory capacity, the common data lines become relatively long. Thus, the common data lines also have comparatively large storage capacitances. Therefore, when the information of the memory cell is read out, potential changes to be applied to the pair of data lines by the memory cell have their changing rates limited by the parasitic capacitances. Similarly, potential changes to be applied from the pair of data lines to the pair of common data lines are limited by the storage capacitances of the latter. In other words, the potential difference which is applied between the pair of common data lines in accordance with the information read out from the memory cell does not increase rapidly. To the contrary, the increase is relatively low.

Although the sense amplifier referred to above has a comparatively great gain, this gain is still unsatisfactory for the sense amplifier of the large-capacity static RAM. Therefore, when the potential difference between the pair of common data lines has become a comparatively great value, an output signal capable of driving the data output buffer is first provided form the sense amplifier. A comparatively long time is accordingly required before the data output buffer comes into operation after the information signals complementary to each other have been delivered from the memory cell to the pair of data lines.

Moreover, in the foregoing sense amplifier, the differential amplifier circuit is constructed as a dissymmetric type differential amplifier circuit. This is a type of differential amplifier which receives a pair of input signals complementary to each other and which forms a single output signal having a potential relative to the ground potential of the circuitry which corresponds to the potential difference between the input signals. In consequence, the data output buffer detects the potential of the output signal from the sense amplifier on the basis of its logic threshold voltage relative to the ground potential of the circuitry. In this regard, however, the characteristics of elements constituting the data output buffer vary due to the variations of manufacturing conditions, etc. The variation of the characteristics of the elements results in the variation of the logic threshold voltages of data output buffers. In order to prevent any malfunction of the static RAM attributed to such variation of the logic threshold voltage of the data output buffer, the sense amplifier should desirably form an output signal of the largest possible amplitude. Since, however, the gain of the foregoing sense amplifier is not very high, the potential difference between the pair of common data lines must be still greater to the end of forming the output signal of the large amplitude. Therefore, an even longer time is taken before the data output buffer is operated. The operating speed of the static RAM has accordingly been greatly limited by these problems.

In addition, the characteristics of elements constituting the sense amplifier vary due to the variations of manufacturing conditions, etc. This can result in the sense amplifier having an offset. The sense amplifier is accordingly disadvantageous in that an offset voltage caused by the offset is transmitted to the data output buffer as it is.

For the above reasons, when the foregoing type of sense amplifier is employed, the output buffer cannot be driven by the sense amplifier until the potential difference between the pair of common data lines CDL and $\overline{CDL}$ reaches such a comparatively great value as 0.5 volt. This has formed a serious obstacle to achieving the high-speed operation of the static RAM.

SUMMARY OF THE INVENTION

An object of this invention is to provide a semiconductor memory device which has a high operating speed.

Another object of this invention is to provide a semiconductor memory device which is equipped with a sense amplifier of high sensitivity in which variations of the characteristics of its elements and the influence of noise thereon are reduced.

According to this invention, a sense amplifier is constructed of first and second dissymmetric type differential amplifier circuits which receive signals on a pair of common data lines CDL and $\overline{CDL}$. The first dissymmetric type differential amplifier circuit forms an output signal having a potential that changes in the same direction (i.e. the same phase) as the direction in which the potential of the signal of the common data line $\overline{CDL}$ changes, while the second dissymmetric type differential amplifier circuit forms an output signal having a potential that changes in the same direction (i.e., the same phase) as the direction in which the potential of the signal of the common data line CDL changes.

BRIEF DESCRIPTION OF THE DRAWINGS

FIG. 2A is a block diagram of the internal arrangement of a static RAM embodying this invention, while FIGS. 2B and 2C are timing charges of the static RAM in FIG. 2A;

FIG. 3A is a block diagram of the internal arrangement of a static RAM showing another embodiment, while FIGS. 3B and 3C are timing charts of the static RAM in FIG. 3A;

DESCRIPTION OF THE PREFERRED EMBODIMENTS

Hereunder, this invention will be described in detail in conjunction with various embodiments thereof.

Arrangement and Operation of a Static Memory System

Figure 1:
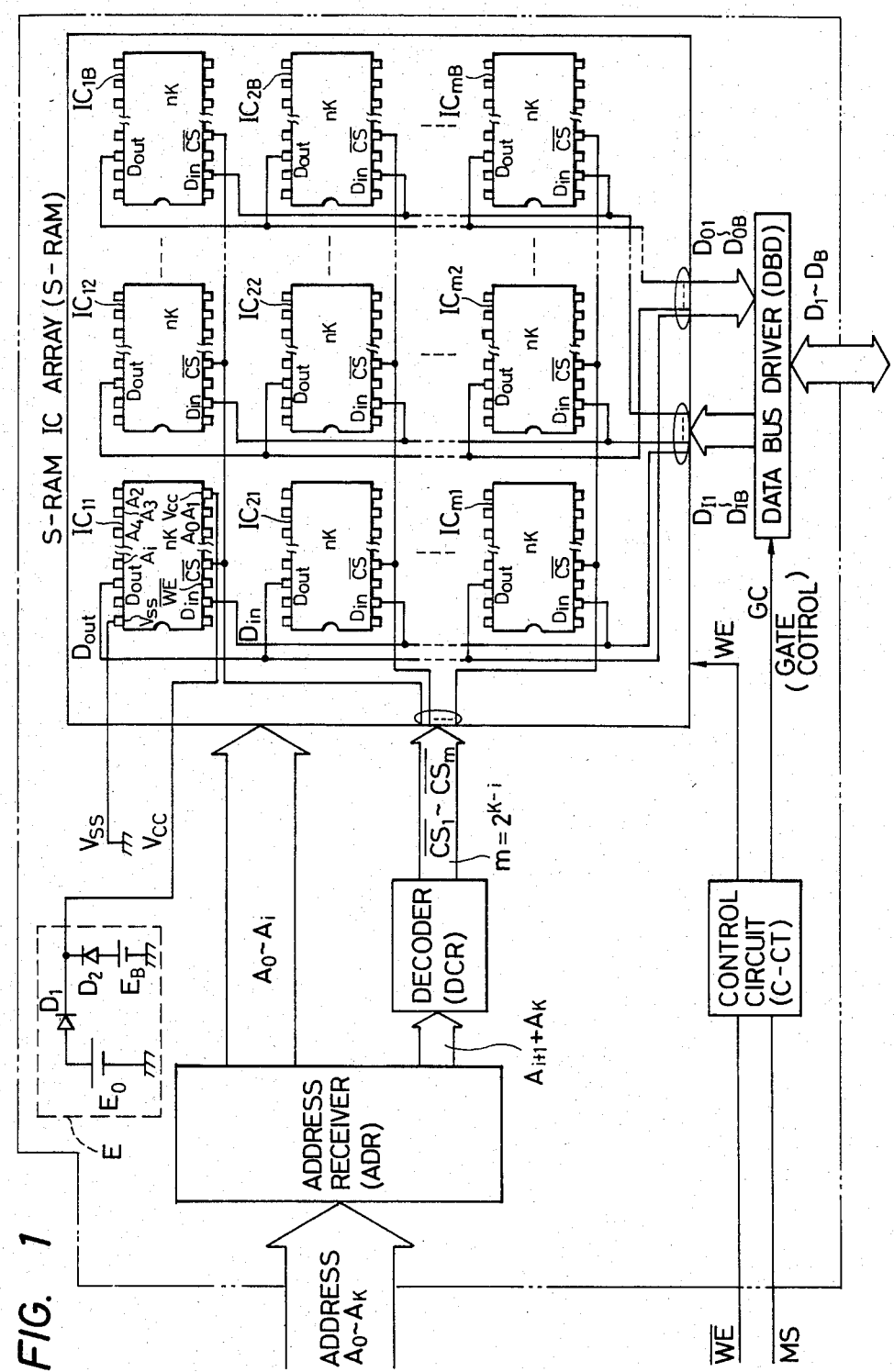
FIG. 1 is a block diagram of a static memory system.

The arrangement of a static memory system will be described with reference to FIG. 1. The static memory system is generally enclosed with a broken line. This system includes an S-RAM IC Array (hereinbelow, termed "S-RAM") constructed of a plurality of static RAMs, a central processing unit (hereinbelow, termed "CPU", and not shown) in a computer, and interface circuits between the S-RAM and the CPU. Letter E indicates a power circuit which includes a backup function. A power supply $E_0$ is constructed of, for example, a device which steps down and rectifies a commercial A.C. voltage, while a power supply $E_B$ is constructed of a battery. Usually, the supply voltage of the system is fed from the power supply $E_0$. When the power supply $E_0$ has been turned "off" or when it is out of order, the supply voltage of the system is fed from the auxiliary power supply $E_B$. Thus, even when the main power supply has been turned "off", the stored contents of the memory chip are retained by the auxiliary power supply $E_B$. Supply voltages $V_{CC}$ and $V_{SS}$ are commonly to all the static RAMs.

The input/output signals between the static memory system and the CPU will now be explained. Address signals $A_0$ to $A_k$ are signals for selecting a plurality of desired memory cells from among $2^k$ memory cells in the S-RAM enclosed with a solid line. Among them, the address signals $A_0$ to $A_i$ are allotted as address signals common to the various static RAMs, while the address signals $A_{i+1}$ to $A_k$ are allotted as signals for selecting m rows of IC arrays and are used as chip select signals $\overline{CS}$ common to the static RAMs of the respective row. $\overline{WE}$ indicates a write enable signal, which is a signal for reading and writing instructions of data in the S-RAM and which is fed to the $\overline{WE}$ terminals of all the static RAMs. MS indicates a memory start signal which starts the memory operation of the S-RAM. $D_1$ to $D_8$ indicate input/output data on data bus lines which connect the CPU and the S-RAM.

Now, the static memory system will be described for the S-RAM and the interface circuits separately. First, the S-RAM is constructed of the IC array in which the static RAMs each having a memory capacity of n·k bits. (Hereinbelow, the RAM shall be termed "n·k-static RAM". 1k bits denote $2^{10}=1024$ bits.) The static RAMs are arrayed with a number of m in each column and a number of B in each row, and are connected in the shape of a matrix of $(n \times m)$ words $\times$ B bits. The data input terminals $D_{in}$ and data output terminals $D_{out}$ of the static RAMs in each of the B columns are respectively connected in common.

Secondly, the interface circuits will be described. ADR denotes an address receiver which receives the address signals $A_0$ to $A_k$ transmitted from the CPU and which converts them into the address signals of timings adapted for the operations of the S-RAM.

DCR denotes a decoder which transmits chip select control signals (hereinbelow, termed "$\overline{CS_1}$ to $\overline{CS_m}$" where $m=2^{k-i}$) for selecting the static RAMs instructed by the address signals $A_{i+1}$ to $A_k$ from among the plurality of static RAMs constituting the S-RAM.

DBD indicates a data bus driver whose data input/output between the CPU and the S-RAM are changed-over by a gate control signal GC. The gate control signal GC is formed by the logical combination between the write enable signal $\overline{WE}$ and the memory start signal MS.

Data output signals $D_{O1}$ to $D_{OB}$ from the IC array are output signals which are read out from the data output terminals of the static RAMs (numbering B) of selected rows which are supplied to the DBD. Data input signals $D_{I1}$ to $D_{IB}$ to the IC array are data to be written into desired memory cells, and they are delivered from the DBD and supplied to the data input terminals $D_{in}$ of the static RAMs (numbering B) of the selected row.

Now, the functions of the address signals within the static memory system will be explained.

The address signals $A_0$ to $A_k$ from the CPU are classified into two types. The address signals $A_0$ to $A_i$ are used as address signals for selecting a desired memory cell from within a memory matrix constructed of a plurality of memory cells, in each of the static RAMs constituting the S-RAM. On the other hand, the address signals $A_{i+1}$ to $A_k$ to used as the chip select signal concerning whether or not the whole static RAM is selected as viewed from each of the static RAMs constituting the S-RAM.

Circuit Arrangement of 16k words $\times$ 1 bit-static RAM

Figure 2A:
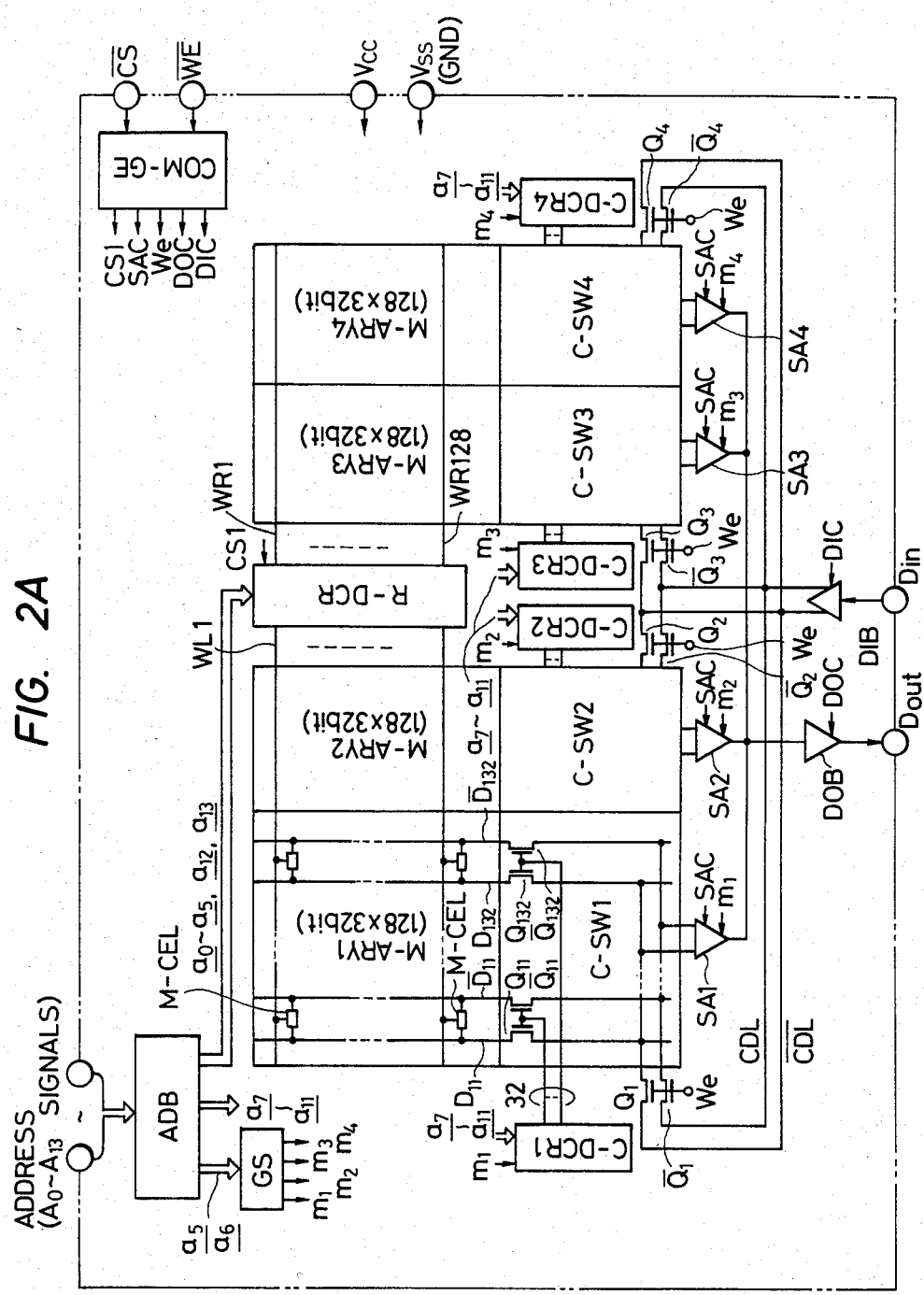

FIG. 2A shows the internal arrangement of a static RAM which has a memory capacity of 16k bits and whose input and output operations are executed in single bit units.

This static RAM of 16k bits includes four matrices (memory arrays M-ARY1 to M-ARY4) all having equal memory capacities. In each matrix, memory cells are arrayed into 128 rows $\times$ 32 columns. Therefore, each of the matrices has a memory capacity of 4096 bits (4k bits). The matrices are dividedly arranged in such a manner that two of them lie on each of the right and left sides of a row decoder R-DCR.

$2^8=256$ decoded output signals which are obtained on the basis of the address signals $A_0$ to $A_5$, $A_{12}$ and $A_{13}$ are respectively transmitted from the row decoder R-DCR to the address selecting lines of rows (word lines WL1 to WL128 and WR1 to WR128). In this manner, each of the memory cells M-CEL constituting the respective matrices is connected to any one of the word lines WL1 to WL128 and WR1 to WR128 and any one pair of pairs of complemental data lines D11, $\overline{D11}$ to D132, $\overline{D132}$ to be described later.

The address signals $A_5$ and $A_6$ are used for selecting only one of the memory matrices: In order to select one column in the selected memory matrix, the address signals $A_7$ to $A_{11}$ are used.

A circuit GS receives the address signals $A_5$ and $A_6$, and forms four types of memory matrix selecting signals $m_1$ to $m_4$ corresponding to these address signals. Each of the column decoders C-DCR1 to C-DCR4 delivers $2^5 = 32$ decoded output signals for selecting columns, on the basis of the address signals $A_7$ to $A_{11}$.

In a reading operation, a pair of common data lines CDL and $\overline{CDL}$ are divided into four in correspondence with the respective memory arrays by transistors to divide the common data lines ($Q_1$, $\overline{Q_1}$; ... ; and $Q_4$, and $\overline{Q_4}$), while in a writing operation, the pair of common data lines CDL and $\overline{CDL}$ are coupled in common. Sense amplifiers SA1, SA2, SA3 and SA4 are respectively disposed in correspondence with the divided parts of the pair of common data lines CDL and $\overline{CDL}$.

Dividing the pair of common data lines CDL and $\overline{CDL}$ and equipping the respective divided parts with the sense amplifiers SA1, SA2, SA3 and SA4 in this manner divides the storage capacitances of the pair of common data lines CDL and $\overline{CDL}$ to increase the speed of the reading operation.

An address buffer ADB prepares 14 pairs of complemental address signals $a_0$ to $a_{13}$ from the 14 external address signals $A_0$ to $A_{13}$, respectively, and delivers them to the decoder circuits (R-DCR, C-DCR and GS).

An internal control signal generating circuit COM-GE receives the two external control signals $\overline{CS}$ (chip select signal) and $\overline{WE}$ (write enable signal), and delivers signals CS1 (row decoder control signal), SAC (sense amplifier control signal), We (writing control signal), DOC (data output buffer control signal) and DIC (data input buffer control signal).

Circuit Operation of 16k words × 1 bit-static RAM

The circuit operation of the static RAM shown in FIG. 2A will be described with reference to the timing charts shown in FIGS. 2B and 2C.

All operations in the static RAM, that is, an address setting operation, the reading operation and the writing operation, are carried out only in the interval in which one external control signal $\overline{CS}$ is at the low level. Herein, the reading operation is executed when the other external control signal $\overline{WE}$ is at the high level, and the writing operation is executed when it is at the low level.

First, the address setting operation and the reading operation will be described.

When the external control signal $\overline{CS}$ is at the low level, the address setting operation is continually executed on the basis of the address signals applied during this interval. By keeping the external control signal $\overline{CS}$ at the high level, on the other hand, the address setting operation and the reading operation based on indefinite address signals can be prevented.

When the external control signal $\overline{CS}$ has become the low level, the internal control signal generator COM-GE generates the internal control signal CS1 of the high level in synchronism with this signal $\overline{CS}$. The row decoder R-DCR starts its operation by receiving this internal control signal CS1 of the high level. The row decoder (serving also as a word driver) R-DCR decodes the 8 types of pairs of complemental address signals $a_0$ to $a_5$, $a_{12}$ and $a_{13}$ supplied from the address buffer ADB, and it selects one word line from among the plurality of word lines and drives it to the high level.

On the other hand, any one of the 4 memory arrays M-ARY1 to M-ARY4 is selected by the memory array selecting signals $m_1$ to $m_4$. In the selected memory array (for example, M-ARY1), one pair of complemental data lines (for example, D11 and $\overline{D11}$) are selected by the column decoder (for example, C-DCR1). More specifically, when the memory array M-ARY1 has been selected by the memory selecting signal $m_1$, the column decoder C-DCR1 starts its operation in response to the selecting signal $m_1$. The column decoder C-DCR1 decodes the 5 types of pairs of complemental address signals $a_7$ to $a_{11}$ supplied from the address buffer ADB, and brings one decoder output signal for column selection into the high level. In the above example, MISFETs $Q_{11}$ and $\overline{Q_{11}}$ are brought into the "on" states by the decoded output signal for column selection. Thus, one pair of complemental data lines (D11 and $\overline{D11}$) are selected. In this way, one memory cell coupled to one word line and one pair of complemental data lines is selected (address setting).

Information stored in the memory cell selected by the address setting operation is delivered to one pair of divided parts of the pair of common data lines, and is amplified by the sense amplifier (for example, SA1). In this case, any one of the 4 sense amplifiers SA1, SA2, SA3 and SA4 is selected by the memory array selecting signals $m_1$ to $m_4$. Only the selected sense amplifier operates during the interval during which the internal control signal SAC of the high level is received.

In this manner, the three sense amplifiers which need not be used among the four sense amplifiers SA1, SA2, SA3 and SA4 are held in the non-operating states. Thus, the power dissipation of the static RAM can be rendered low. The outputs of the three sense amplifiers in the non-operating states are held in high impedance (floating) states.

The output signal of the sense amplifier is amplified by the data output buffer DOB, and is transmitted to outside the static RAM as output data $D_{out}$. The data output buffer DOB operates only during the interval during which the control signal DOC of the high level is received.

The writing operation will now be described.

When the external control signal $\overline{WE}$ has become the low level, the control signal we of the high level synchronous therewith is supplied from the internal control signal generator COM-GE to the transistors to divide the common data lines ($Q_1$, $\overline{Q_a}$; ... ; and $Q_4$, $\overline{Q_4}$). Since all the transistors for dividing the common data lines are thus brought into the "on" states, the pair of common data lines having been divided in the reading operation are coupled in the writing operation. That is, in the writing operation, the common data line CDL becomes a single common data line coupled electrically, and the common data line $\overline{CDL}$ similarly becomes a single common data line coupled electrically.

On the other hand, a data input buffer DIB amplifies an input data signal $D_{in}$ from outside the static RAM and delivers the amplified signal to the pair of common data lines CDL and $\overline{\text{CDL}}$ coupled in common, during the interval during which the control signal DIC of the low level is received. The input data signals transmitted to the pair of common data lines CDL and $\overline{\text{CDL}}$ are written into the single memory cell M-CEL set by the address setting operation.

Circuit Arrangement of 2k words×8 bits-static RAM

Figure 3A:
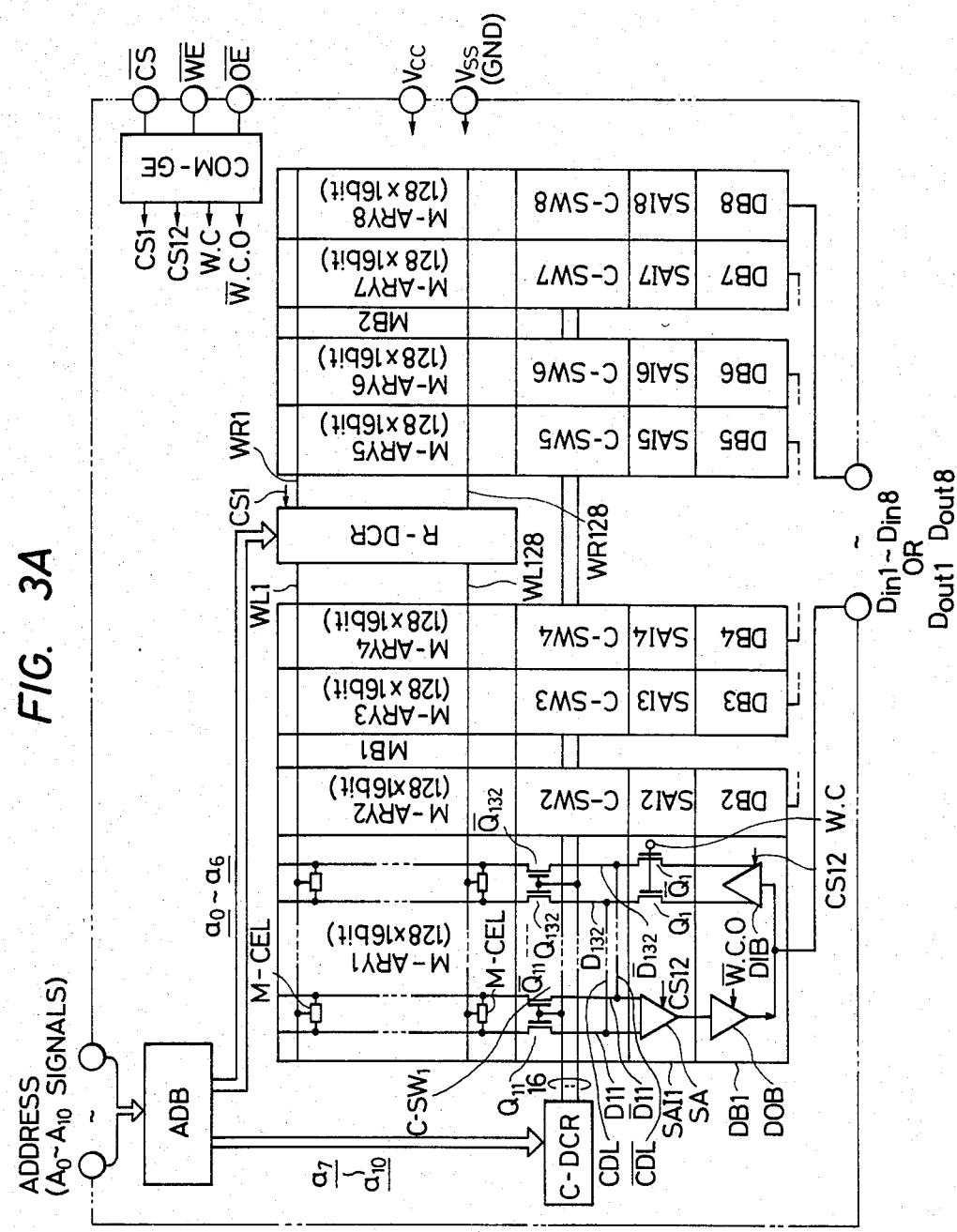

FIG. 3A shows the internal arrangement of a static RAM which has a memory capacity of 16k bits and whose input and output operations are executed in 8 bit units.

This memory IC of 16k bits includes eight matrices (memory arrays M-ARY1 to M-ARY 8) all having equal memory capacities. In each matrix, memory cells are arrayed into 128 rows×16 columns. Therefore, each of the matrices has the memory capacity of 2048 bits (2k bits). As shown in the figure, the matrices are dividedly arranged in such a manner that four of them lie on each of the right and left sides of a row decoder R-DCR.

$2^7 = 128$ decoded output signals which are obtained on the basis of the address signals $A_0$ to $A_6$ are respectively transmitted from the row decoder R-DCR to the address selecting lines of rows (word lines WL1 to WL128 and WR1 to WR128). In this manner, each of the memory cells M-CEL of the respective matrices is connected to any one of the word lines WL1 to WL128 and WR1 to WR128 and any one of pairs of complemental data lines D11, $\overline{\text{D11}}$ to D132, $\overline{\text{D132}}$ to be described later.

Word-line intermediate buffers MB1 and MB2 have amplification actions in order to reduce to the utmost delay times at the ends of the word lines WL1 to WL128 and WR1 to WR128. These buffers MB1 and MB2 are interposed between the memory arrays M-ARY2 and M-ARY3 and the memory arrays M-ARY6 and M-ARY7, respectively.

The address signals $A_7$ to $A_{10}$ are used for selecting one pair of complemental data lines from each of the eight matrices. A column decoder C-DCR delivers $2^4 = 16$ decoded output signals for selecting columns, on the basis of the address signals $A_7$ to $A_{10}$.

An address buffer ADB prepares 11 pairs of complemental address signals $a_0$ to $a_{10}$ from the 11 external address signals $A_0$ to $A_{10}$, respectively, and delivers them to the decoder circuits (R-DCR and C-DCR).

An internal control signal generating circuit COM-GE receives three external control signals $\overline{\text{CS}}$ (chip select signal), $\overline{\text{WE}}$ (write enable signal) and $\overline{\text{OE}}$ (output enable signal), and delivers signals CS1 (row decoder control signal), CS12 (sense amplifier and data input buffer-control signal), W.C (writing control signal) and $\overline{\text{W}}$.C.O (data output buffer-control signal).

Circuit Operation of 2k words×8 bits-static RAM

The circuit operation of the static RAM shown in FIG. 3A will now be described with reference to timing charts in FIGS. 3B and 3C.

All operations in the static RAM, that is, the address setting operation, the reading operation and the writing operation, are carried out only in the interval in which the external control signal $\overline{\text{CS}}$ is at the low level. Herein, the reading operation is conducted when the other external control signal $\overline{\text{WE}}$ is at the high level, and the writing operation when it is at the low level. The external control signal $\overline{\text{OE}}$ is used for controlling an output timing in the case of transmitting an output signal of 8 bits out of the static RAM.

First, the address setting operation and the reading operation will be described.

When the external control signal $\overline{\text{CS}}$ is at the low level, the address setting operation is continually executed on the basis of the signals applied during this interval. By keeping the external control signal $\overline{\text{CS}}$ at the high level, on the other hand, the address setting operation and the reading operation based on indefinite address signals can be prevented.

When the external control signal $\overline{\text{CS}}$ has become the low level, the internal control signal CS1 of the high level synchronous with this signal $\overline{\text{CS}}$ is provided from the internal control signal generator COM-GE. Upon receiving the internal control signal CS1 of the high level, the row decoder R-DCR starts its operation. The row decoder (serving also as a word driver) R-DCR decodes the 7 types of pairs of complemental address signals $a_0$ to $a_6$ supplied from the address buffer ADB, and it selects one pair of right and left word lines from among the plurality of word lines and drives them to the high level.

On the other hand, the column decoder C-DCR selects one column from each of the 8 memory arrays M-ARY1 to M-ARY8. That is, the column decoder C-DCR decodes the pairs of complemental address signals $a_7$ to $a_{10}$ supplied from the address buffer ADB, and it provides decoded output signals for column selection to select one column from each of the respective memory arrays. One pair of complemental data lines are selected from each memory array by these decoded output signals for column selection.

In this way, eight memory cells coupled to the selected word lines and the pairs of complemental data lines selected for the respective memory arrays are selected (address setting). That is, one memory cell is selected in each memory array.

Information of the memory cells selected by the address setting operation is delivered to the pairs of common data lines CDL and $\overline{\text{CDL}}$ of the respective memory arrays, and are amplified by the respective sense amplifiers SA. The sense amplifiers SA begin to operate in response to the fact that the control signal CS12 becomes the high level in synchronism with the external control signal $\overline{\text{CS}}$. It continues to operate during the interval in which this signal CS12 is at the high level.

The output signals of the sense amplifiers SA are amplified by data output buffers DOB, and are transmitted out of the static RAM as output data $D_{out1}$ to $D_{out8}$. With regard to this, it should be noted that the data output buffers DOB operate during the interval during which the control signal $\overline{\text{W}}$.C.O of the high level is received.

Next, the writing operation will be described.

When both the external control signals $\overline{\text{WE}}$ and $\overline{\text{CS}}$ have become the low level, the internal control generator COM-GE synchronously supplies the control signal W.C of the high level to writing control transistors ($Q_1$, $\overline{Q_1}$; ...; and $Q_4$, $\overline{Q_4}$). Thus, the writing control transistors are brought into the "on" states, and the respective pairs of common data lines CDL and $\overline{\text{CDL}}$ and the corresponding data input buffers DIB are coupled.

On the other hand, the data input buffers DIB disposed in correspondence with the respective memory arrays amplify the 8 input data signals $D_{in1}$ to $D_{in8}$ applied from outside the static RAM, respectively, and transmit the amplified signals to the pairs of common data lines CDL and $\overline{CDL}$ disposed in correspondence with the respective memory arrays, during the interval in which the control signal CS12 of the low level is received.

The input data signals transmitted to the pairs of common data lines are respectively written into the 8 memory cells M-CEL set by the address setting operation.

Memory Cell Circuit

Figure 4:
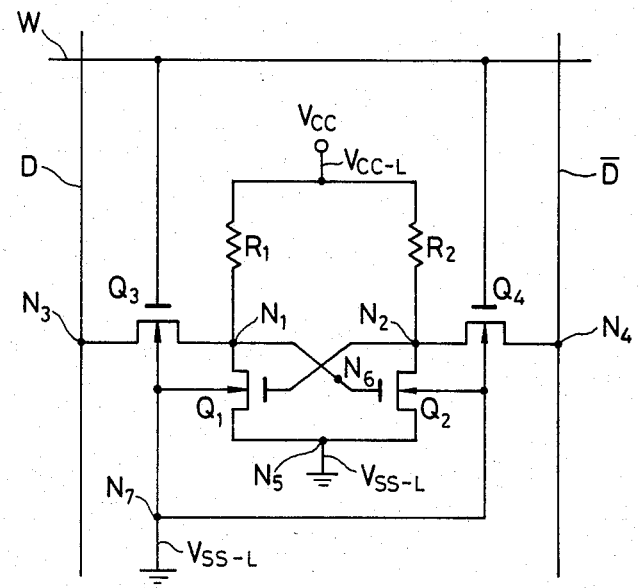
FIG. 4 is a circuit diagram of a memory cell of 1 bit in a memory cell array.

FIG. 4 shows an example of the circuit of the memory cell M-CEL of 1 bit in the memory array of FIG. 2A or FIG. 3A. This memory cell is constructed of a flip-flop in which the inputs and outputs of a pair of inverter circuits consisting of load resistors $R_1$, $R_2$ and driving MISFETs $Q_1$, $Q_2$ connected in series are cross-connected, and a pair of MISFETs $Q_3$, $Q_4$ for transmission gates. The flip-flop is used as means for storing information, the transmission gate MISFETs are used as addressing means for controlling the transmission of information between the flip-flop and the pair of complemental data lines D and $\overline{D}$ ($D_{11}$, $\overline{D}_{11}$; . . . ; $D_{132}$, $\overline{D}_{132}$), and the operations thereof are controlled by the address signal applied to the word line W (WL1, . . . WL128, WR1, . . . WR128) connected to the row decoder R-DCR.

Peripheral Circuits

Figure 5:
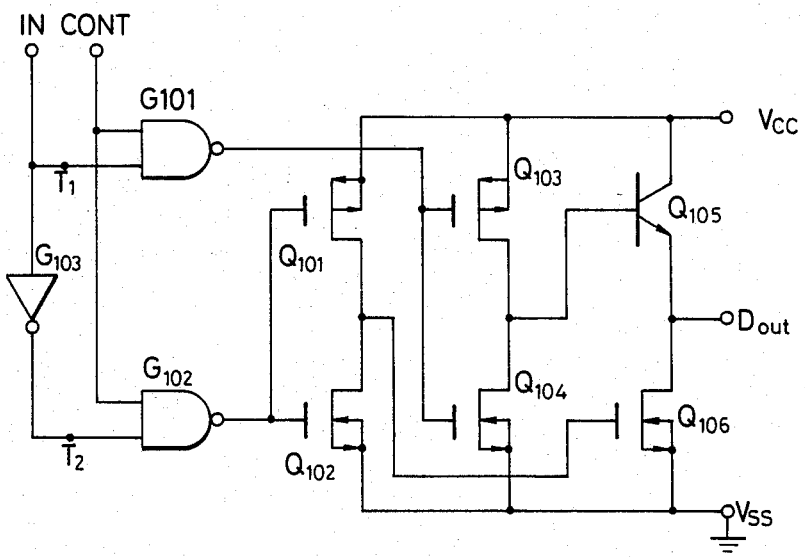
FIG. 5 is a circuit diagram of a data output buffer.

FIG. 5 shows a peripheral circuit such as, for example, the data output buffer DOB in FIG. 2A or FIG. 3A. With the data output buffer DOB, when a control signal CONT is logic "1" ($+V_{cc}$), an output $V_{out}$ becomes a logic value conforming with an input signal In, and a very low output impedance is obtained. In contrast, when the control signal CONT is "0", the output $V_{out}$ of the data output buffer DOB becomes an indefinite level independent of the input signal In, that is, a very high output impedance is obtained. The buffer having both the high and low output impedances in this manner, makes it possible to form wired-OR among the output signals of a plurality of buffers.

In the final stage, a bipolar transistor $Q_{105}$ of great drivability is used so that a heavy load can be driven at high speed. The bipolar transistor $Q_{105}$ constructs a push-pull circuit along with an N-channel MISFET $Q_{106}$ which is greater in drivability than a P-channel MISFET. To serve as the above control signal CONT, either the signal $D_{oc}$ or $\overline{W}.C.O$ mentioned previously can be used.

Figure 6:
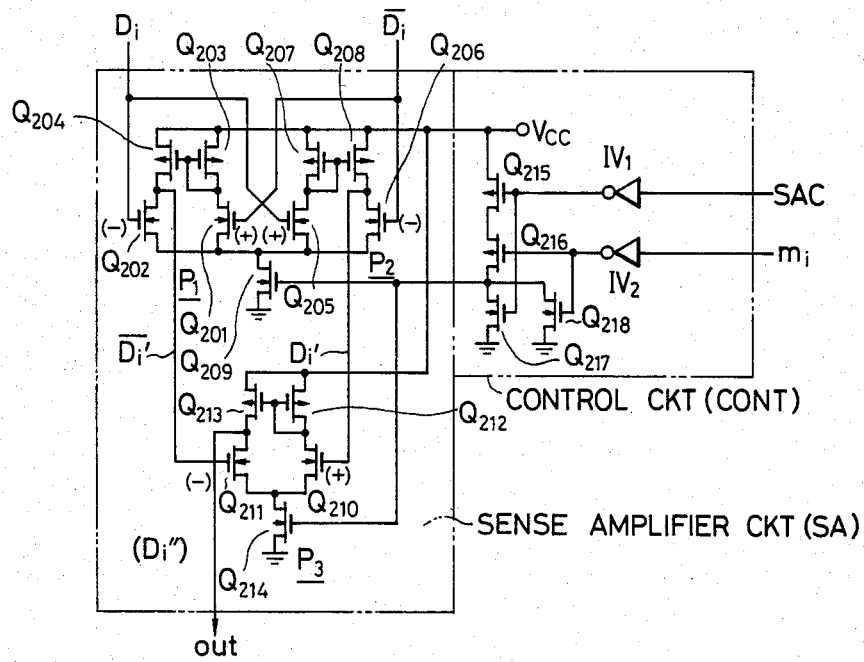
FIG. 6 is a circuit diagram of a sense amplifier.

FIG. 6 is a circuit diagram showing an embodiment of the sense amplifier SA for use in the foregoing static RAM.

In this embodiment, the sense amplifier SA is constructed of a first dissymmetric type differential amplifier circuit $P_1$ which is composed of a pair of N-channel MISFETs $Q_{201}$ and $Q_{202}$ coupled in the differential mode, and active load P-channel MISFETs $Q_{203}$ and $Q_{204}$ connected to the drains of the respective differential MISFETs and constituting a current mirror circuit; a second dissymmetric type differential amplifier circuit $P_2$ which is composed of MISFETs $Q_{205}$ to $Q_{208}$ which has the same arrangement as that of the dissymmetric type differential amplifier circuit $P_1$; and a third dissymmetric type differential amplifier circuit $P_3$ which is composed of MISFETs $Q_{210}$ to $Q_{214}$ and which has the same arrangement as that of the dissymmetric type differential amplifier circuit $P_1$ or $P_2$.

The first and second dissymmetric type differential amplifier circuits $P_1$ and $P_2$ receive the signals $D_i$ and $\overline{D}_i$ from the pair of common data lines CDL and $\overline{CDL}$, respectively. The first dissymmetric type differential amplifier circuit $P_1$ forms an output signal $\overline{D}_i'$ whose potential changes in the same direction (i.e., in-phase) as the direction in which the potential of the signal $\overline{D}_i$ changes, while the second dissymmetric type differential amplifier circuit $P_2$ forms an output signal $D_i'$ whose potential changes in the same direction (i.e., in phase) as the direction in which the potential of the signal $D_i$ changes. More specifically, the gates of the MISFETs $Q_{202}$ and $Q_{206}$ being the inverting input terminals (−) of the first and second dissymmetric type differential amplifier circuits $P_1$ and $P_2$ are respectively supplied with the signal $D_i$ and $\overline{D}_i$. The gates of the MISFETs $Q_{201}$ and $Q_{205}$ being the non-inverting input terminals (+) are respectively supplied with the signals $\overline{D}_i$ and $D_i$ by the crossconnection. In consequence, the first dissymmetric type differential amplifier circuit $P_1$ provides the output signal $\overline{D}_i'$ whose potential changes in the same direction (in-phase) as the direction of the potential change of the signal $\overline{D}_i$, while the second dissymmetric type differential amplifier circuit $P_2$ provides the output signal $D_i'$ whose potential changes in the same direction (in-phase) as the direction of the potential change of the signal $D_i$. Moreover, the constituent loads of the first and second dissymmetric type differential amplifier circuits $P_1$ and $P_2$ are active loads. Therefore, the first dissymmetric type differential amplifier circuit $P_1$ can form the output signal $\overline{D}_i'$ whose potential changes more than the change of the potential of the signal $\overline{D}_i$, while the second dissymmetric type differential amplifier circuit $P_2$ can form the output signal $D_i'$ whose potential changes more than the change of the potential of the signal $D_i$.

In this embodiment, the output signals $D_i'$ and $\overline{D}_i'$ from the first and second dissymmetric type differential amplifier circuits $P_1$ and $P_2$ are applied to the third dissymmetric type differential amplifier circuit $P_3$ in order to provide a large voltage gain for the sense amplifier. An output signal OUT ($D_i''$) from the third dissymmetric type differential amplifier circuit $P_3$ is transmitted to the input terminal IN of the data output buffer DOB shown in FIG. 5.

In this embodiment, an N-channel MISFET $Q_{209}$ is provided as a constant-current source common to the first and second dissymmetric type differential amplifier circuits $P_1$ and $P_2$. In place of the MISFET $Q_{209}$, MISFETs constructing constant-current sources may well be disposed in the respective dissymmetric type differential amplifier circuits $P_1$ and $P_2$.

Each of the first, second and third differential amplifier circuits $P_1$, $P_2$ and $P_3$ receives a pair of signals complementary to each other, and delivers a signal having a potential which corresponds to the potential difference between the complementary signals with respect to the ground potential of the circuitry. That is, the differential amplifier circuit receives the two signals and delivers the single signal only. It should be noted that there is a type of differential amplifier circuit, which receives two signals and delivers two signals. In order to distinguish the differential amplifier circuit of this type from the foregoing differential amplifier circuit (for example, $P_1$, $P_2$ or $P_3$), the latter has been referred to throughout this description as a "dissymmetric type differential amplifier circuit" as stated above.

In a case where a desired sense amplifier is selected from among the plurality of sense amplifiers as in the embodiment shown in FIG. 2A, the MISFETs $Q_{209}$ and $Q_{214}$ which serve as the constant-current sources are switched and controlled by a control circuit CONT which is constructed of an inverter circuit $IV_1$ receiving a control signal SAC, an inverter circuit $IV_2$ receiving a memory array selecting signal $m_i$, and MISFETs $Q_{215}$ to $Q_{218}$.

In contrast, in a case where the plurality of sense amplifiers is simultaneously operated as in the embodiment of FIG. 3A, the signal CS12 as shown in FIG. 3B is applied to the gates of the MISFETs $Q_{209}$ and $Q_{214}$ as the constant-current sources.

According to this embodiment, the signals $D_i'$ and $\overline{D_i}'$ balanced to each other are formed by the use of the two dissymmetric type differential amplifier circuits $P_1$ and $P_2$. That is, the signals $D_i'$ and $D_i'$ which correspond to the signal $D_i$ and $\overline{D_i}$ complementary to each other and which are amplified are formed by the first and second dissymmetric type differential amplifier circuits $P_1$ and $P_2$. More specifically, when the potential of the signal $D_i'$ has risen, by way of example, the potential of the signal $\overline{D_i}'$ lowers an amount substantially equal to the rise value of the potential of the signal $D_i'$. Therefore, the similar dissymmetric type differential amplifier circuit $P_3$ can be disposed at the succeeding stage in order to further raise the gain.

The first and second dissymmetric type differential amplifier circuits $P_1$ and $P_2$ can be endowed with offset voltages similar to each other by forming them within an identical monolithic IC. More specifically, in case the first and second dissymmetric type differential amplifier circuits $P_1$ and $P_2$ are formed on an identical semiconductor substrate, the changes of the characteristics of elements constituting the first dissymmetric type differential amplifier circuit $P_1$ as attributed to the variations of manufacturing conditions, etc. become similar to the changes of the characteristics of elements constituting the second dissymmetric type differential amplifier circuit $P_2$. In consequence, the offset of the first dissymmetric type differential amplifier circuit ascribable to the changes of the characteristics of the constituent elements becomes substantially similar to the offset of the second dissymmetric type differential amplifier circuit also ascribable to the changes of the characteristics of the elements. It is supposed by way of example that when the input terminals (+) and (−) of the first dissymmetric type differential amplifier circuit $P_1$ are supplied with a pair of input signals which render the potential difference between them zero (V), a certain positive offset voltage is provided from the dissymmetric type differential amplifier circuit $P_1$ on account of the offset thereof. Then, when the second dissymmetric type differential amplifier circuit $P_2$ is supplied with the same input signals as those of the first one $P_1$, it provides on account of its offset an offset voltage similar to the offset voltage provided from the first dissymmetric type differential amplifier circuit $P_1$.

Therefore, the output signals $D_i'$ and $\overline{D_i}'$ formed by the dissymmetric type differential amplifier circuits $P_1$ and $P_2$ include the offset voltages similar to each other. The output signals $D_i'$ and $\overline{D_i}'$ are respectively applied to the third dissymetric type differential amplifier circuit $P_3$. Because of a differential amplifier circuit, this third dissymmetric type differential amplifier circuit $P_3$ can cancel the offset voltage of the first dissymmetric type differential amplifier circuit $P_1$ included in the output signal $D_i'$ and the offset voltage of the second dissymmetric type differential amplifier circuit $P_2$ included in the output signal $\overline{D_i}'$. Accordingly, the offset voltages of the first and second dissymmetric type differential amplifier circuits $P_1$ and $P_2$ are not included in the output signal OUT (D''). An offset voltage possessed by the third dissymmetric type differential amplifier circuit $P_3$ is, on the other hand, transmitted to the succeeding stage. Since, however, the signal level of the output signal OUT (D'') of this dissymmetric type differential amplifier circuit $P_3$ is sufficiently great, any such offset voltage from the third dissymmetric amplifier $P_3$ can be substantially neglected.

Since the offsets of the dissymmetric type differential amplifier circuit $P_2$ and $P_1$ are cancelled in the third dissymmetric type differential amplifier circuit $P_3$, respectively, the MISFETs $Q_{209}$ and $Q_{214}$ constituting the constant sources can be simultaneously operated. Therefore, the output signal OUT (D'') can be derived at high speed. Accordingly, the static RAM is capable of very high speed operation.

Even in a case where in-phase noise has acted on the input signals $D_i$ and $\overline{D_i}$, it is cancelled because the circuits $P_1$ and $P_2$ are differential amplifier circuits. Accordingly, such noise is not transmitted to the succeeding stage. Likewise, even in a case where in-phase noise is included in the output signals $D_i'$ and $\overline{D_i}'$, it is cancelled and is not transmitted to the succeeding stage because the circuit $P_3$ is a differential amplifier circuit.

As described above, according to this embodiment, a sense amplifier can be provided which reduces the influences of noise and of the offset voltages possessed by the differential amplifier circuits, and which exhibits a high sensitivity as well as a high gain. For this reason, even when the potential difference between the signals $D_i$ and $\overline{D_i}$ from the pair of common data lines is comparatively small, the sense amplifier can drive the data output buffer satisfactorily. Accordingly, the sense amplifier can drive the data output buffer within a short time after the pair of information signals complementary to each other have been delivered from the memory cell to the pair of data lines D and $\overline{D}$. It is therefore possible to attain a high-speed operation of the static RAM. For example, even when the voltage difference of the signal $D_i$ and $\overline{D_i}$ from the pair of common data lines CDL and $\overline{CDL}$ is as small as about 0.2 volt, the sense amplifier SA of this embodiment can form an output signal great enough to drive the data output buffer DOB. This permits very rapid static RAM operation.

The dissymmetric type differential amplifier circuit shown in FIG. 6 can be replaced with a latch circuit including a pair of MISFETs having gates and drains which are cross-connected to each other. In this case, however, a comparatively long time is required for releasing a status held in the latch circuit and bringing the latch circuit into the opposite status. Therefore, the operating speed of the static RAM is limited, and it cannot be made as high as the arrangement using dissymmetric amplifiers.

In the circuit of the embodiment shown in FIG. 6, it is also allowed to omit the third dissymmetric type differential amplifier circuit $P_3$ and to transmit the signals $D_i'$ and $\overline{D_i}'$ to the data output buffer DOB of the succeeding stage. In this case, in the data output buffer DOB shown in FIG. 5, the inverter circuit $G_{103}$ is omitted, and the signals $D_i'$ and $\overline{D_i}'$ are directly applied to the respective terminals $T_1$ and $T_2$. Therefore, the data output buffer DOB can be simplified.

If this simplification is made, the balanced signals $D_i'$ and $\overline{D_i'}$ are made the output signals of the sense amplifier SA. Therefore, the potential difference between the output signals of the sense amplifier SA becomes approximately double in comparison with the amplitude of the output signal of the sense amplifier which employs the single dissymmetric type differential circuit as stated before. In other words, such a sense amplifier SA comes to have a gain which is approximately double that of the prior-art sense amplifier. And, as stated before, this sense amplifier can cancel in-phase noise.

In this case, a static RAM of still fewer malfunctions can be provided in such a way that the balanced signals $D_i'$ and $\overline{D_i'}$ are compared in the data output buffer and that the potential of the output signal of the data output buffer is determined to the high level or the low level on the basis of the result of the comparison. More specifically, in the case where, as described before, the high level or low level of the output signal of the sense amplifier is detected depending upon whether the potential of the output signal from the sense amplifier is higher or lower than the logic threshold voltage of the data output buffer with respect to the ground potential of the circuitry, the noise margin of the data output buffer becomes small due to the variation of the logic threshold voltage attributed to the variations of the manufacturing conditions. In contrast, the comparison between the balanced signals $D_i'$ and $\overline{D_i'}$ is a comparison between the relative potentials of the two signals. This makes it less susceptible to the variations of the manufacturing conditions than a comparison between the output signal of the sense amplifier and a reference voltage (threshold voltage) whose value varies depending upon the manufacturing conditions as stated above. Accordingly, the present invention allows for a static RAM having fewer malfunctions than conventional arrangements.

Figure 7:
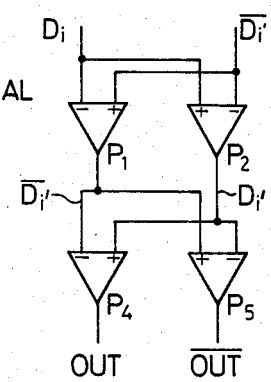
FIG. 7 is a block diagram of a sense amplifier showing another embodiment.

FIG. 7 shows a block diagram of another embodiment of ths invention.

In this embodiment, the balanced signals $D_i'$ and $\overline{D_i'}$ are formed by dissymmetric type differential amplifier circuits $P_1$ and $P_2$ in a manner similar to the foregoing embodiment of FIG. 6. However, unlike the foregoing embodiment, balanced output signals OUT and $\overline{OUT}$ are formed by disposing similar dissymmetric type differential amplifier circuits $P_4$ and $P_5$. Since the practicable circuits of the respective dissymmetric type differential amplifier circuits $P_1$, $P_2$ and $P_4$, $P_5$ are similar to those in FIG. 6, they are not repeatedly explained.

If the balanced signals OUT and $\overline{OUT}$ for the FIG. 7 embodiment are applied to the data output buffer DOB shown in FIG. 5, the inverter circuit $G_{103}$ in this data output buffer DOB is omitted, and the output signals OUT and $\overline{OUT}$ are directly applied to the one-side input terminals $T_1$ and $T_2$ of the respective gate circuits $G_{101}$ and $G_{102}$. Accordingly, the data output buffer DOB can be simplified. In this embodiment, the balanced signals OUT and $\overline{OUT}$ are made the output signals of the sense amplifier. Therefore, the potential difference between the output signals of this sense amplifier becomes approximately double the amplitude of the output signal OUT of the sense amplifier shown in FIG. 6. In other words, the sense amplifier of this embodiment has a gain which is approximately double that of the sense amplifier SA shown in FIG. 6.

Also in this embodiment, by forming the dissymmetric type differential amplifiers $P_1$ and $P_2$ on an identical semiconductor substrate, offset voltages possessed by the dissymmetric type differential amplifier circuits $P_1$ and $P_2$ are cancelled in the dissymmetric type differential amplifier circuits $P_4$ and $P_5$ for the same reason as explained in connection with FIG. 6. Accordingly, the offset voltages of the dissymmetric type differential amplifier circuits $P_1$ and $P_2$ are not included in the output signals OUT and $\overline{OUT}$. The offset voltages of the dissymmetric type differential amplifier circuits $P_4$ and $P_5$ are respectively included in the output signals OUT and $\overline{OUT}$. Since, however, the potential difference between the output signals OUT and $\overline{OUT}$ is sufficiently greater than the offset voltages, these offset voltages are substantially negligible.

In case in-phase noise is included in the signals $D_i$ and $\overline{D_i}$, it is cancelled in the dissymmetric type differential amplifier circuits $P_1$ and $P_2$. Similarly, in case in-phase noise is included in the signals $D_i'$ and $\overline{D_i'}$, it is cancelled in the dissymmetric type differential amplifier circuits $P_4$ and $P_5$. Accordingly, even when the in-phase noise has acted on the signals $D_i$, $\overline{D_i}$ or (and) the signals $D_i'$, $\overline{D_i'}$, the respective potentials of the output signals OUT and $\overline{OUT}$ are not changed by the noise.

As described above, according to this embodiment, a sense amplifier is provided which reduces the influences of the offset voltages and noise still more and which has a high sensitivity as well as a high gain.

Figure 8:
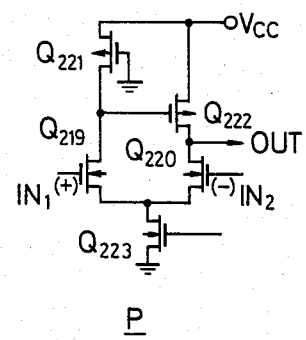
FIG. 8 is a circuit diagram of a dissymmetric type differential amplifier circuit of another embodiment for use in the sense amplifier.

FIG. 8 is a circuit diagram showing another practicable embodiment of the dissymmetric type differential amplifier circuit P which can be used for any of the circuits $P_1$ to $P_5$ heretofore described if desired.

In this FIG. 8 embodiment, the dissymmetric type differential amplifier circuit is constructed of a pair of N-channel MISFETs $Q_{219}$ and $Q_{220}$ which are connected in the differential mode, a P-channel MISFET $Q_{221}$ whose gate is grounded and which serves as the load of the MISFET $Q_{219}$, and a P-channel MISFET $Q_{222}$ whose gate has the common drain of the MISFETs $Q_{219}$ and $Q_{221}$ connected thereto. The dissymmetric type differential amplifier circuit P of this embodiment has a higher gain than a dissymmetric type differential amplifier circuit such as $P_1$ in FIG. 6 which employs a current mirror circuit as its load. On the other hand, however, it has a comparatively great offset voltage relative to $P_1$ of FIG. 6.

More specifically, in the dissymmetric type differential amplifier P of FIG. 8, the MISFET $Q_{221}$ operates as the load having a comparatively great resistance. It is therefore permitted to apply a comparatively great voltage between the gate and source of the MISFET $Q_{222}$. In consequence, this dissymmetric type differential amplifier P has a high gain. However, the characteristics of the MISFET $Q_{219}$ and those of the MISFET $Q_{220}$ can differ from one another on account of, for example, the variations of the manufacturing conditions. In a case where, in spite of input signals of equal potentials being applied to a non-inverting input terminal (+) and an inverting input terminal (−), the drain current of the MISFET $Q_{219}$ has become higher than that of the MISFET $Q_{220}$, a comparatively great voltage is applied between the gate and source of the MISFET $Q_{222}$ because the MISFET $Q_{221}$ is the load having the comparatively great resistance. Therefore, the mutual conductance of the MISFET $Q_{222}$ becomes high, and a current of high value is provided. Thus, the dissymmetric type differential amplifier circuit P has the comparatively great offset voltage.

Although the FIG. 8 embodiment does have a higher offset voltage than the arrangement shown in FIG. 6, it should be noted that when the dissymmetric type differential amplifier circuit as shown in FIG. 8 is used for the dissymmetric type differential amplifier circuits $P_1$ and $P_2$ in FIG. 6 or 7, the offset voltages are cancelled. Therefore, the offset voltage poses no problem, and the high gain of the FIG. 8 embodiment can be exploited.

Figure 9:
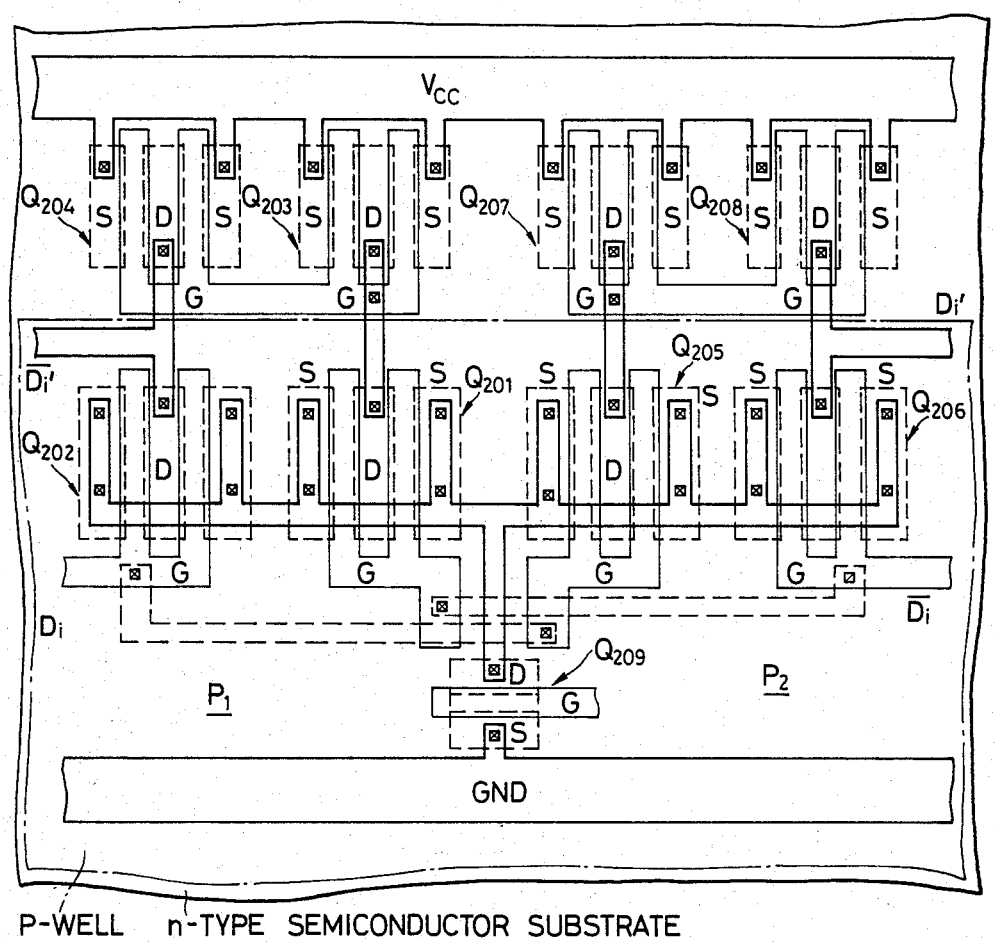
FIG. 9 is a layout diagram of the principal portions of the sense amplifier.

FIG. 9 shows a layout diagram (plan view) in the case where the dissymmetric type differential amplifier circuits $P_1$ and $P_2$ in FIG. 6 or 7 are formed on a monolithic IC.

In FIG. 9, parts enclosed with thick solid lines indicate aluminum wiring layers. The aluminum wiring layers are used as the wiring layer of the supply voltage $V_{cc}$, the wiring layer of the ground potential GND of the circuitry, a wiring layer for connecting the respective source layers of the differential MISFETs $Q_{201}$, $Q_{202}$ and $Q_{205}$, $Q_{206}$ in common, and a wiring layer for connecting the drain layer of the differential MISFET and the drain layer of the load MISFET.

In this figure, parts enclosed with thin solid lines indicate conductive polycrystalline silicon layers. The conductive polycrystalline silicon layers are used for the gate electrodes of the respective MISFETs and wiring layers associated therewith.

Parts enclosed with broken lines in FIG. 9 indicate p-type or n-type diffused layers. The diffused layers are used as the source layer or drain layer of the MISFET and a wiring layer for connecting the gate of the differential MISFET.

Finally, the part enclosed with a dot-and-dash line in FIG. 9 indicates a p-type well layer formed on an n-type substrate. Accordingly, the n-channel MISFETs are formed in the p-well. Marks x indicate contacts.

Although a specific overall static type RAM operation has been described for use with the sense amplifier of the present invention, it is to be understood that variations of this can be made.

It is to be understood that the above described arrangements are simply illustrative of the application of the principles of this invention. Numerous other arrangements may be readily devised by those skilled in the art which embody the principles of the invention and fall within its spirit and scope.

We claim:

1. A static type semiconductor random access memory comprising:
    one or more memory cells each of which delivers a pair of signals complementary to each other;
    a first dissymmetric type differential amplifier circuit having a non-inverting input terminal coupled to said memory cells to receive one signal of the pair of complementary signals, and an inverting input terminal coupled to said memory cells to receive the other signal of said pair of complementary signals, said first amplifier circuit including means for forming a first output signal in-phase with said signal received at its non-inverting input terminal;
    a second dissymmetric type differential amplifier circuit having an inverting input terminal coupled to said memory cells to receive said one signal, and a non-inverting input terminal coupled to said memory cells to receive said other signal, said second amplifier circuit including means for forming a second output signal in-phase with said signal received at its non-inverting input terminal; and
    first means coupled to said first and second amplifier circuits to receive said first output signal and said second output signal, said first means including means for forming a third output signal based on said first output signal and said second output signal,
    wherein each of said first and second dissymmetric type differential amplifier circuits is a dissymmetric type differential amplifier which comprises a first insulated-gate field effect transistor of a first conductivity type having its gate coupled to said non-inverting input terminal, a second insulated-gate field effect transistor of said first conductivity type having its gate coupled to said inverting input terminal and having its source coupled to a source of said first insulated-gate field effect transistor, and first active load means connected between respective drains of said first and second insulated-gate field effect transistors and a first power supply, said first and second dissymmetric type differential amplifier circuits being coupled to at least one constant current source connected between sources of said first and second insulated-gate field effect transistors and a second power supply, and in which the signal in-phase with said signal received at its non-inverting input terminal is derived from said drain of said second insulated-gate field effect transistor.

2. A static type semiconductor random access memory according to claim 1, wherein said first means comprises:
    a third dissymmetric type differential amplifier circuit having a non-inverting input terminal coupled to said first amplifier to receive said first output signal, and an inverting input terminal coupled to said second amplifier to receive said second output signal, said third amplifier including means for forming a fourth output signal in-phase with said signal received at its non-inverting input terminal; and
    output means coupled to said third amplifier to receive said fourth output signal, said output means including means for forming said third output signal.

3. A static type semiconductor random access memory according to claim 1, wherein said first means comprises:
    a fourth dissymmetric type differential amplifier circuit having a non-inverting input terminal coupled to said first amplifier to receive said first output signal, and an inverting input terminal coupled to said second amplifier to receive said second output signal, said fourth amplifier including means for forming a fifth output signal in-phase with said signal received at its non-inverting input terminal;
    a fifth dissymmetric type differential amplifier circuit having an inverting input terminal coupled to said first amplifier to receive said first output signal, and a non-inverting input terminal coupled to said second amplifier to receive said second output signal, said fifth amplifier including means for forming a sixth output signal in-phase with said signal received at its non-inverting input terminal; and
    output means coupled to said fourth and fifth amplifiers to receive said fifth output signal and said sixth output signal, said output means including means for forming said third output signal.

4. A static type semiconductor random access memory according to claim 1, wherein said first active load means comprises a fifth insulated-gate field effect transistor of a second conductivity type whose drain is coupled to the drain of said second insulated-gate field effect transistor and whose gate is coupled to the drain of said first insulated-gate field effect transistor, and first load means coupled between the gate and a source of said fifth insulated-gate fiel effect transistor.

5. A static type semiconductor random access memory according to claim 1, wherein said first means comprises an output buffer including means to form said third output signal as a logic signal having one of two possible levels in accordance with the potential levels of said first and second output signals.

6. A static type semiconductor random access memory according to claim 2, wherein said third dissymmetric type differential amplifier circuit is a dissymmetric type differential amplifier circuit which comprises a third insulated-gate field effect transistor of said first conductivity type having its gate coupled to said non-inverting input terminal, a fourth insulated-gate field effect transistor of said first conductivity type having its gate coupled to said inverting input terminal and having its source coupled to a source of said third insulated-gate field effect transistor, and second active load means coupled to respective drains of said third and fourth insulated-gate field effect transistors, and in which the signal in-phase with said signal received at its non-inverting input terminal is derived from said drain of said fourth insulated-gate field effect transistor.

7. A static type semiconductor random access memory according to claim 2, wherein said output means comprises an output buffer including means to form said third output signal as a logic signal having one of two possible levels in accordance with the potential level of said fourth output signal.

8. A static type semiconductor random access memory according to claim 3, wherein each of said fourth and fifth dissymmetric type differential amplifier circuit is a dissymmetric type differential amplifier circuit which comprises a third insulated-gate field effect transisor of said first conductivity type having its gate coupled to said non-inverting input terminal, a fourth insulated-gate field effect transistor of said first conductivity type having its gate coupled to said inverting input terminal and having its source coupled to a source of said third insulated-gate field effect transistor, and second active load means coupled to respective drains of said third and fourth insulated-gate field effect transistors, and in which the signal in-phase with said signal received at its non-inverting input terminal is derived from said drain of said fourth insulated-gate field effect transistor.

9. A static type semiconductor random access memory according to claim 3, wherein said output means comprises an output buffer including means to form said third output signal as a logic signal having one of two possible levels in accordance with the potential levels of said fifth and sixth output signals.

10. A static type semiconductor random access memory according to claim 1, wherein said first load means comprises a seventh insulated-gate field effect transistor of said second conductivity type whose source is connected to the source of said fifth insulated-gate field effect transistor and whose gate and drain are coupled to the gate of said fifth insulated-gate field effect transistor.

11. A static type semiconductor random access memory according to claim 6 or 8, wherein said second active load means comprises a fifth insulated-gate field effect transistor of a second conductivity type whose drain is coupled to the drain of said fourth insulated-gate field effect transistor and whose gate is coupled to the drain of said third insulated-gate field effect transistor, and first load means coupled between the gate and a source of said fifth insulated-gate field effect transistor, and wherein said first active load means comprises a sixth insulated-gate field effect transistor of said second conductivity type whose drain is coupled to the drain of said second insulated-gate field effect transistor and whose gate is coupled to the drain of said first insulated-gate field effect transistor, and second load means coupled between the gate and a source of said sixth insulated-gate field effect transistor.

12. A static type semiconductor random access memory according to claim 11, wherein said second load means comprises a seventh insulated-gate field effect transistor of said second conductivity type whose source is coupled to the source of said fifth insulated-gate field effect transistor and whose gate and drain are coupled to the gate of said fifth insulated-gate field effect transistor, and wherein said first load means comprises an eighth insulated-gate field effect transistor of said second conductivity type whose source is coupled to the source of said sixth insulated-gate field effect transistor and whose gate and drain are coupled to the gate of said sixth insulated-gate field effect transistor.

13. A static type semiconductor random access memory according to claim 11, wherein said first load means includes a ninth insulated-gate field effect transistor of said second conductivity type whose source is coupled to the source of said sixth insulated-gate field effect transistor, whose drain is coupled to the drain of said first insulated-gate field effect transistor and whose gate is coupled to a ground potential point of the circuitry.

14. A sense amplifier coupled to at least one static type semiconductor random access memory cell which delivers a pair of signals complementary to each other, comprising:
a first dissymmetric type differential amplifier circuit having a non-inverting input terminal coupled to said memory cell to receive one signal of the pair of complementary signals, and an inverting input terminal coupled to said memory cell to receive the other signal of said pair of complementary signals, said first amplifier circuit including means for forming a first output signal in-phase with said signal received at its non-inverting input terminal, said first output signal having a potential level which corresponds to the potential difference between said complementary signals and a ground potential of the circuit; and
a second dissymmetric type differential amplifier circuit having an inverting input terminal coupled to said memory cell to receive said one signal, and a non-inverting input terminal coupled to said memory cell to receive said other signal, said second amplifier circuit including means for forming a second output signal in-phase with said signal received at its non-inverting input terminal, said second output signal having a potential level which corresponds to the potential difference between said complementary signals and a ground potential of the circuit, wherein each of said first and second dissymmetric type differential amplifier circuits is a dissymmetric type differential amplifier which comprises a first insulated-gate field effect transistor of a first conductivity type having its gate coupled to said non-inverting input terminal, a second insulated-gate field effect transistor of said first conductivity type having its gate coupled to said inverting input terminal and having its source applied to a source of said first insulated-gate field effect transistor, and first active load means connected between respective drains of said first and second insulated-gate field effect transistors and a first power supply, said first and second dissymmetric type differential amplifier circuits being coupled to at least one constant current source connected between sources of said first and second insulated-gate field effect transistors and a second power supply, and in which the signal in-phase with said signal received at its non-inverting input terminal is derived from said drain of said second insulated-gate field effect transistor.

15. A sense amplifier according to claim 14, further comprising:
a third dissymmetric type differential amplifier circuit having a non-inverting input terminal coupled to said first amplifier to receive said first output signal, and an inverting input terminal coupled to said second amplifier to receive said second output signal, said third amplifier including means for forming a third output signal in-phase with said signal received at its non-inverting inputer terminal, said third output signal having a potential level which corresponds to the potential difference between the first and second output signals and the ground potential of the circuit.

16. A sense amplifier according to claim 14, further comprising:
a fourth dissymmetric type differential amplifier circuit having a non-inverting input terminal coupled to said first amplifier to receive said first output signal, and an inverting input terminal coupled to said second amplifier to receive said second output signal, said fourth amplifier including means for forming a fourth output signal in-phase with said signal received at its non-inverting input terminal, said fourth output signal having a potential level which corresponds to the potential difference between said first and second output signals and the ground potential of the circuit; and
a fifth dissymmetric type differential amplifier circuit having an inverting input terminal coupled to said first amplifier to receive said first output signal, and a non-inverting input terminal coupled to said second amplifier to receive said second output signal, said fifth amplifier including means for forming a fifth output signal in-phase with said signal received at its non-inverting input terminal, said fifth output signal having a potential level which corresponds to the potential difference between said first and second output signals and the ground potential of the circuit.

* * * * *